US007011868B2

(12) United States Patent
Waldfried et al.

(10) Patent No.: US 7,011,868 B2
(45) Date of Patent: Mar. 14, 2006

(54) FLUORINE-FREE PLASMA CURING PROCESS FOR POROUS LOW-K MATERIALS

(75) Inventors: Carlo Waldfried, Falls Church, VA (US); Qingyuan Han, Columbia, MD (US); Orlando Escorcia, Falls Church, VA (US); Ralph Albano, Columbia, MD (US); Ivan L. Berry, III, Ellicott City, MD (US); Atsushi Shiota, Ibaraki (JP)

(73) Assignee: Axcelis Technologies, Inc., Beverly, MA (US)

( * ) Notice: Subject to any disclaimer, the term of this patent is extended or adjusted under 35 U.S.C. 154(b) by 124 days.

(21) Appl. No.: 10/627,894

(22) Filed: Jul. 24, 2003

(65) Prior Publication Data

US 2004/0028916 A1 Feb. 12, 2004

Related U.S. Application Data

(63) Continuation-in-part of application No. 10/346,560, filed on Jan. 17, 2003, now abandoned, which is a continuation-in-part of application No. 09/952,649, filed on Sep. 14, 2001, now Pat. No. 6,913,796, which is a continuation-in-part of application No. 09/681,332, filed on Mar. 19, 2001, now Pat. No. 6,558,755, and a continuation-in-part of application No. 09/528,835, filed on Mar. 20, 2000, now Pat. No. 6,576,300.

(51) Int. Cl.
*C08J 7/18* (2006.01)
*H01L 21/26* (2006.01)
*H01L 21/3105* (2006.01)
*H01L 21/314* (2006.01)
*H05L 1/24* (2006.01)

(52) U.S. Cl. ................ 427/489; 427/535; 427/536; 438/788; 438/789; 438/780

(58) Field of Classification Search ................ 427/488, 427/489, 491, 535, 536, 537; 438/780, 781, 438/783, 788, 789, 792, 793
See application file for complete search history.

(56) References Cited

U.S. PATENT DOCUMENTS

| | | | |
|---|---|---|---|
| 3,615,272 A | 10/1971 | Collins et al. | |
| 4,636,440 A | 1/1987 | Jada | |
| 4,749,631 A | 6/1988 | Haluska et al. | |
| 4,756,977 A | 7/1988 | Haluska et al. | |
| 4,808,653 A | 2/1989 | Haluska et al. | |
| 4,822,697 A | 4/1989 | Haluska et al. | |
| 4,842,888 A | 6/1989 | Haluska et al. | |
| 4,847,162 A | 7/1989 | Haluska et al. | |
| 4,999,397 A | 3/1991 | Weiss et al. | |
| 5,008,320 A | 4/1991 | Haluska et al. | |
| 5,010,159 A | 4/1991 | Bank et al. | |
| 5,063,267 A | 11/1991 | Hanneman et al. | |
| 5,116,637 A | 5/1992 | Baney et al. | |
| 5,210,160 A | 5/1993 | Saive et al. | |
| 5,234,556 A | 8/1993 | Oishi et al. | |
| 5,262,201 A | 11/1993 | Chandra et al. | |
| 5,290,394 A | 3/1994 | Sasaki | |
| 5,416,190 A | 5/1995 | Mine et al. | |
| 5,523,163 A | 6/1996 | Balance et al. | |
| 5,547,703 A | 8/1996 | Camilletti et al. | |
| 5,618,878 A | 4/1997 | Syktich et al. | |
| 5,853,808 A | * 12/1998 | Arkles et al. ............... 427/515 |
| 5,879,744 A | 3/1999 | Cao et al. | |
| 5,935,646 A | 8/1999 | Raman et al. | |

(Continued)

FOREIGN PATENT DOCUMENTS

| | | |
|---|---|---|
| EP | 1037275 | 9/2000 |
| EP | 1189267 | 3/2002 |
| JP | 60-086017 A | 5/1985 |
| WO | WO 0170628 | 9/2001 |
| WO | WO 03/025993 A | 3/2003 |

OTHER PUBLICATIONS

Glasser et al., Effect of the H20/TEOS Ratio Upon The Preparation and Nitridation of Silica Sol/Gel Films, Journal of Non–Crystalline Solids,1984, 13pgs., vol. 63, Elsevier Science Publishers B.V., North–Holland, Amsterdam, no month.

Han Q. et al., "Ultra Low–K Porous Silicon Dioxide Films from A Plasma Process", Proceedings of the IEEE, International Interconnect Technology Conference, Jun. 4, 2001, pp. 171–173.

Kim J–J et al., "The Effects of Plasma Treatment on SiO2 Aerogel Film Using Various Reactive (O2, H2, N2) and Non–Reactive (He, Ar) Gases", Thin Solid Films, Elsevier–Sequoia S.A. Lausanne, CH, vol. 377–378, Dec. 1, 2000, pp. 525–529.

Abstract for JP 59-178749A toTakeda (Fujitsu), Oct. 11, 1984.

Abstract for JP 63–107122A to Fukuyama et al. (Fujitsu) May 12, 1988.

Primary Examiner—Marianne Padgett
(74) Attorney, Agent, or Firm—Dinsmore & Shohl LLP

(57) ABSTRACT

Low dielectric constant porous materials with improved elastic modulus and material hardness. The process of making such porous materials involves providing a porous dielectric material and plasma curing the porous dielectric material with a fluorine-free plasma gas to produce a fluorine-free plasma cured porous dielectric material. Fluorine-free plasma curing of the porous dielectric material yields a material with improved modulus and material hardness, and with comparable dielectric constant. The improvement in elastic modulus is typically greater than or about 50%, and more typically greater than or about 100%. The improvement in material hardness is typically greater than or about 50%. It is emphasized that this abstract is provided to comply with the rules requiring an abstract which will allow a searcher or other reader to quickly ascertain the subject matter of the technical disclosure. It is submitted with the understanding that it will not be used to interpret or limit the scope or meaning of the claims 37 CFR §1.72(b).

21 Claims, No Drawings

U.S. PATENT DOCUMENTS

| | | | |
|---|---|---|---|
| 5,961,851 A | | 10/1999 | Kamarehi et al. |
| 6,054,206 A | | 4/2000 | Mountsier |
| 6,080,526 A | | 6/2000 | Yang et al. |
| 6,133,137 A | * | 10/2000 | Usami .................. 438/662 |
| 6,143,360 A | | 11/2000 | Zhong |
| 6,149,987 A | | 11/2000 | Perng et al. |
| 6,184,260 B1 | | 2/2001 | Zhong |
| 6,231,989 B1 | | 5/2001 | Chung et al. |
| 6,232,424 B1 | | 5/2001 | Zhong et al. |
| 6,265,320 B1 | * | 7/2001 | Shi et al. .................. 216/67 |
| 6,284,050 B1 | * | 9/2001 | Shi et al. .................. 427/509 |
| 6,313,045 B1 | | 11/2001 | Zhong et al. |
| 6,346,490 B1 | * | 2/2002 | Catabay et al. .......... 438/788 |
| 6,359,096 B1 | | 3/2002 | Zhong et al. |
| 6,576,546 B1 | * | 6/2003 | Gilbert et al. ........... 438/629 |
| 6,599,829 B1 | * | 7/2003 | Smith et al. ............. 438/636 |
| 6,620,733 B1 | * | 9/2003 | Ho ........................... 438/700 |
| 6,647,994 B1 | * | 11/2003 | Lui et al. ................. 438/725 |
| 6,756,085 B1 | * | 6/2004 | Waldfried et al. ........ 427/515 |
| 2001/0029283 A1 | * | 10/2001 | Nakamura et al. ....... 427/551 |
| 2001/0046781 A1 | | 11/2001 | Nakagawa |
| 2002/0106500 A1 | | 8/2002 | Albano et al. |
| 2002/0136910 A1 | | 9/2002 | Harker |
| 2004/0253388 A1 | * | 12/2004 | Kim ......................... 427/536 |
| 2005/0048795 A1 | * | 3/2005 | Ko et al. .................. 438/778 |
| 2005/0064698 A1 | * | 3/2005 | Chang et al. ............. 438/623 |

\* cited by examiner

FLUORINE-FREE PLASMA CURING PROCESS FOR POROUS LOW-K MATERIALS

CROSS-REFERENCE TO RELATED APPLICATIONS

This application is a continuation-in-part of U.S. patent application Ser. No. 10/346,560, filed Jan. 17, 2003 now abandoned and entitled "FLUORINE-FREE PLASMA CURING PROCESS FOR POROUS LOW-K MATERIALS", which is a continuation-in-part of U.S. patent application Ser. No. 09/952,649, filed Sep. 14, 2001 and entitled "PLASMA CURING PROCESS FOR POROUS LOW-K MATERIALS", now U.S. Pat. No. 6,913,796 which is a continuation-in-part of U.S. patent application Ser. No. 09/528,835, filed Mar. 20, 2000 and entitled "HIGH MODULUS, LOW DIELECTRIC CONSTANT COATINGS" (now U.S. Pat. No. 6,576,300) and a continuation-in-part of U.S. patent application Ser. No. 09/681,332, filed Mar. 19, 2001 and entitled "PLASMA CURING PROCESS FOR POROUS SILICA THIN FILM" (now U.S. Pat. No. 6,558,755), the disclosures of which are incorporated herein by reference.

BACKGROUND OF THE INVENTION

This invention relates generally to a process which is employed in manufacturing semiconductor chips. More particularly, the invention relates to a process for improving the structural properties of certain porous materials that are utilized as integrated circuit (IC) dielectrics.

New materials with low dielectric constants (known in the art as "low-k dielectrics") are being investigated for their potential use as insulators in semiconductor chip designs. A low dielectric constant material aids in enabling further reductions in integrated circuit feature dimensions. The substance with the lowest dielectric constant is air (k=1.0). Therefore, porous dielectrics are very promising candidates since they have the potential to provide very low dielectric constants. Unfortunately, however, such porous low-k dielectrics typically have the problem of insufficient mechanical strength.

Thin film dielectric coatings on electric devices are known in the art. For instance, U.S. Pat. Nos. 4,749,631 and 4,756,977, to Haluska et al., disclose silica based coatings produced by applying solutions of silicon alkoxides or hydrogen silsesquioxane, respectively, to substrates and then heating the coated substrates to a temperature between 200 and 1000° C. The dielectric constant of these coatings is often too high for certain electronic devices and circuits.

U.S. Pat. Nos. 4,847,162 and 4,842,888, to Haluska et al., teach the formation of nitrided silica coatings by heating hydrogen silsesquioxane resin and silicate esters, respectively, to a temperature between 200 and 1000° C. in the presence of ammonia.

Glasser et al., Journal of Non-Crystalline Solids, 64 (1984) pp. 209–221, teaches the formation of ceramic coatings by heating tetraethoxysilane in the presence of ammonia. This reference teaches the use of anhydrous ammonia and that the resulting silica coatings are nitrided.

U.S. Pat. No. 4,636,440, to Jada, discloses a method of reducing the drying time for a sol-gel coated substrate comprising exposing the substrate to aqueous quaternary ammonium hydroxide and/or alkanol amine compounds. Jada requires that the coating be dried prior to heating. It is specifically limited to hydrolyzed or partially hydrolyzed silicon alkoxides.

U.S. Pat. No. 5,262,201, to Chandra et al., and U.S. Pat. No. 5,116,637, to Baney et al., teach the use of basic catalysts to lower the temperature necessary for the conversion of various preceramic materials, all involving hydrogen silsesquioxane, to ceramic coatings. These references teach the removal of solvent before the coating is exposed to the basic catalysts.

U.S. Pat. No. 5,547,703, to Camilletti et al., teaches a method for forming low dielectric constant Si—O containing coatings on substrates comprising heating a hydrogen silsesquioxane resin successively under wet ammonia, dry ammonia, and oxygen. The resultant coatings have dielectric constants as low as 2.42 at 1 MHz. This reference teaches the removal of solvent before converting the coating to a ceramic.

U.S. Pat. No. 5,523,163, to Balance et al., teaches a method for forming Si—O containing coatings on substrates comprising heating a hydrogen silsesquioxane resin to convert it to a Si—O containing ceramic coating and then exposing the coating to an annealing atmosphere containing hydrogen gas. The resultant coatings have dielectric constants as low as 2.773. The reference teaches the removal of solvent before converting the coating to a ceramic.

U.S. Pat. No. 5,618,878, to Syktich et al., discloses coating compositions containing hydrogen silsesquioxane resin dissolved in saturated alkyl hydrocarbons useful for forming thick ceramic coatings. The alkyl hydrocarbons disclosed are those up to dodecane. The reference does not teach exposure of the coated substrates to basic catalysts before solvent removal.

U.S. Pat. No. 6,231,989, to Chung et al., entitled "METHOD OF FORMING COATINGS" discloses a method of making porous network coatings with low dielectric constants. The method comprises depositing a coating on a substrate with a solution comprising a resin containing at least 2 Si—H groups and a solvent in a manner in which at least 5 volume % of the solvent remains in the coating after deposition. The coating is then exposed to an environment comprising a basic catalyst and water. Finally, the solvent is evaporated from the coating to form a porous network. If desired, the coating can be cured by heating to form a ceramic. Films made by this process have dielectric constants in the range of 1.5 to 2.4 with an elastic modulus between about 2 and about 3 GPa.

Porous low-k dielectric materials produced by spin-on and chemical vapor deposition processes typically require a curing process subsequent to the deposition. Typical process conditions for curing these low-k films include nitrogen purged furnace anneals at temperatures between about 350 and about 450° C. for 30 to 180 minutes. As was described in U.S. patent application Ser. Nos. 09/681,332, 09/952,649, 09/906,276 and 09/952,398, the disclosures of which are incorporated herein by reference, instead of thermally curing and plasma treating, porous network coatings can be plasma or UV cured, eliminating the need for prior furnace curing.

However, there remains a need for a process for making a porous low-k material with improved structural properties, such as an improved elastic modulus and material hardness, without compromising or deteriorating its electrical properties.

SUMMARY OF THE INVENTION

The present invention meets that need by providing a fluorine-free plasma curing process for porous low-k materials.

Although the present invention is not limited to specific advantages or functionality, it is noted that the process produces materials having a low dielectric constant and an improved elastic modulus and material hardness. The process significantly reduces cure process times and enables curing at low wafer temperatures as compared to conventional heat curing techniques, in addition to the advantages associated with eliminating the exposure of the dielectric to fluorine plasma species.

In accordance with one embodiment of the present invention, a process is provided for making a fluorine-free plasma cured material comprising providing a porous dielectric material having a first dielectric constant, having a first elastic modulus, and having a first material hardness. The porous dielectric material is plasma cured with a fluorine-free plasma gas to produce a fluorine-free plasma cured porous dielectric material having a second dielectric constant which is comparable to the first dielectric constant, having a second elastic modulus which is greater than the first elastic modulus, and having a second material hardness which is greater than the first material hardness. By "comparable to" we mean both equal to and slightly less than, such as, for example, a second dielectric constant which is 0.05 less than the first dielectric constant. The increase in elastic modulus is typically greater than or about 50%, and more typically greater than or about 100%. The increase in material hardness is typically greater than or about 50%.

Accordingly, it is an object of the present invention to produce porous dielectric materials having improved elastic modulus and material hardness, and a low dielectric constant.

These and other features and advantages of the invention will be more fully understood from the following detailed description of the invention. It is noted that the scope of the claims is defined by the recitations therein and not by the specific discussion of features and advantages set forth in the present description.

DETAILED DESCRIPTION OF THE INVENTION

The present invention is based on the discovery that plasma curing virtually any porous dielectric material, without the necessity of thermally curing the material, increases the elastic modulus (Young's modulus) and material hardness of the material while maintaining dramatically reduced curing process time without suffering its low dielectric constant properties. The porous dielectric material can include, but is not limited to, organic dielectric materials such as hydrogen silsesquioxane (HSQ), methylsilsesquioxane (MSQ), and combinations thereof, inorganic dielectric materials, and combinations thereof, which can be produced by depositing a dielectric coating on a substrate using spin-on or chemical vapor deposition (CVD) processes. The porous dielectric materials can have porogen-generated, solvent-formed, or molecular engineered pores, which may be interconnected or closed, and which may be distributed random or ordered, such as vertical pores.

The process of the present invention is particularly applicable to the deposition of coatings on electronic devices or electronic circuits where they can serve as interlevel dielectric layers, doped dielectric layers to produce transistor-like devices, pigment loaded binder systems containing silicon to produce capacitor and capacitor-like devices, multilayer devices, 3-D devices, silicon on insulator devices, super lattice devices, and the like. However, the choice of substrates and devices to be coated by the instant invention is limited only by the need for thermal and chemical stability of the substrate at the temperature and pressure used in the present invention. As such, the porous dielectric materials of the present invention can be used on substrates such as plastics including, for example, polyimides, epoxies, polytetrafluoroethylene and copolymers thereof, polycarbonates, acrylics and polyesters, ceramics, leather, textiles, metals, and the like.

As used in the present invention, the expression "ceramic" includes ceramics such as amorphous silica and ceramic-like materials such as amorphous silica-like materials that are not fully free of carbon and/or hydrogen but are otherwise ceramic in character. The expressions "electronic device" or "electronic circuit" include, but are not limited to, silica-based devices, gallium arsenide based devices, silicon carbide based devices, focal plane arrays, opto-electronic devices, photovoltaic cells, and optical devices.

A porous dielectric material is needed as a starting material for the present invention. Typical HSQ-based dielectric materials for use with the present invention include FOx HSQ-based dielectric material and XLK porous HSQ-based dielectric material available from Dow Corning Corporation (Midland, Mich.). In addition, typical ultra low-k porous dielectric MSQ-based materials, made by spin-on processing, for use with the present invention are available from Chemat Technology, Inc. (Northridge, Calif.) and JSR Corporation (Tokyo, Japan).

The following method of producing a porous network coating is provided as an example of the production of a typical porous dielectric material. It is not the inventors' intent to limit their invention to only MSQ-based films. The process of the present invention is applicable to virtually any porous dielectric material.

LKD (available from JSR Corporation, Tokyo, Japan) is a coating composition prepared by dissolving at least one siloxane compound in an organic solvent (hereinafter referred to as "coating composition"). Ingredient (A) which is the siloxane compound in the present invention is a product of the hydrolysis and/or condensation of at least one compound selected from the group consisting of compounds represented by the following formula (1) (hereinafter referred to as "compounds (1)"):

$$R^1_a Si(OR^2)_{4-a} \quad (1)$$

wherein $R^1$ represents a hydrogen atom or a monovalent organic group; $R^2$ represents a monovalent organic group; and a is an integer of 0 to 2, and compounds represented by the following formula (2) (hereinafter referred to as "compounds (2)"):

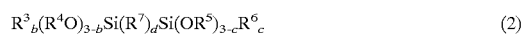

$$R^3_b(R^4O)_{3-b}Si(R^7)_d Si(OR^5)_{3-c}R^6_c \quad (2)$$

wherein, $R^3$, $R^4$, $R^5$, and $R^6$ may be the same or different and each represents a monovalent organic group; b and c may be the same or different and each is an integer of 0 to 2; $R^7$ represents an oxygen atom or a group represented by —$(CH_2)_n$—, wherein n is an integer of 1 to 6; and d is the integer 0 or 1.

Examples of the monovalent organic groups represented by $R^1$ and $R^2$ in formula (1) include alkyl, aryl, allyl, and glycidyl groups. In formula (1), $R^1$ is typically a monovalent organic group, more typically an alkyl or phenyl group.

The alkyl group typically has 1 to 5 carbon atoms, and examples thereof include methyl, ethyl, propyl, and butyl. Those alkyl groups may be linear or branched, and may be ones in which one or more of the hydrogen atoms have been replaced, for example, with fluorine atoms.

In formula (1), examples of the aryl group include phenyl, naphthyl, methylphenyl, ethylphenyl, chlorophenyl, bromophenyl, and fluorophenyl.

Specific examples of the compounds represented by formula (1) include: trialkoxysilanes such as trimethoxysilane, triethoxysilane, tri-n-propoxysilane, triisopropoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotriisopropoxysilane, fluorotri-n-butoxysilane, fluorotri-sec-butoxysilane, fluorotri-tert-butoxysilane, and fluorotriphenoxysilane; tetraalkoxysilanes such as tetramethoxysilane, tetraethoxysilane, tetra-n-propoxysilane, tetraisopropoxysilane tetra-n-butoxysilane, tetra-sec-butoxysilane, tetra-tert-butoxysilane, and tetraphenoxysilane; alkyltrialkoxysilanes such as methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyl triphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane viniltrimethoxysilane, vinyltriethoxysilane, vinyltri-n-propoxysilane, vinyltriisopropoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, and tert-butyltri-tert-butoxysilane; tert-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, vinyltrimethoxysilane, vinyltriethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, and γ-trifluoropropyltriethoxysilane; and dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysiane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, divinyltrimethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, and γ-trifluoropropyltriethoxysilane.

Typical of those compounds (1) are tetramethoxysilane, tetraethoxysilane, tetra-n-propoxysilane, tetraisopropoxysilane, tetraphenoxysilane, methyltrimethoxysilane, methyltriethoxysilane, methyltri-n-propoxysilane, methyltriisopropoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, diphenyldiethoxysilane, trimethylmonomethoxysilane, trimethylmonoethoxysilane, triethylmonomethoxysilane, triethylmonoethoxysilane, triphenylmonomethoxysilane, and triphenylmonoethoxysilane.

In formula (2), examples of the monovalent organic group include the same organic groups as those enumerated above with regard to formula (1).

Examples of the divalent organic group represented by $R^7$ in formula (2) include alkylene groups having 2 to 6 carbon atoms, such as methylene.

Examples of the compounds represented by formula (2) wherein $R^7$ is an oxygen atom include hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentamethoxy-3-phenyldisiloxane, 1,1,1,3,3-pentaethoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,1,3,3-tetraethoxy-1,3-diphenyldisiloxane, 1,1,3,-trimethoxy-1,3,3-trimethyldisiloxane, 1,1,3-triethoxy-1,3,3-trimethyldisiloxane, 1,1,3-trimethoxy-1,3,3-triphenyldisiloxane, 1,1,3-triethoxy-1,3,3-triphenyldisiloxane, 1,3-dimethoxy-1,1,3,3- tetramethyldisiloxane, 1,3-diethoxy-1,1,3,3-tetramethyldisiloxane, 1,3-dimethoxy-1,1,3,3-tetraphenyldisiloxane, and 1,3-diethoxy-1,1,3,3-tetraphenyldisiloxane. Typically, these are hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane,1,3-diethoxy-1,1,3,3-tetraphenyldisiloxane, and the like.

Examples of the compounds represented by formula (2) wherein d is the integer 0 include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentamethoxy-2-phenyldisilane, 1,1,1,2,2-pentaethoxy-2-phenyldisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,1,2,2-tetraethoxy-1,2-diphenyldisilane, 1,1,2-trimethoxy-1,2,2-trimethyldisilane, 1,1,2-triethoxy-1,2,2-trimethyldisilane, 1,1,2-trimethoxy-1,2,2-triphenyldisilane, 1,1,2-triethoxy-1,2,2-triphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, and 1,2-diethoxy-1,1,2,2-tetraphenyldisilane.

Examples of the compounds represented by formula (2) wherein $R^7$ is a group represented by —(CH$_2$)— include bis(hexamethoxysilyl)methane, bis(hexaethoxysilyl)methane, bis(hexaphenoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane, bis(ethoxydiphenylsilyl)methane, bis(hexamethoxysilyl)ethane, bis(hexaethoxysilyl)ethane, bis(hexaphenoxysilyl)ethane, bis(dimethoxymethylsilyl)ethane, bis(diethoxymethylsilyl)ethane, bis(dimethoxyphenylsilyl)ethane, bis(diethoxyphenylsilyl)ethane, bis(methoxydimethylsilyl)ethane, bis(ethoxydimethylsilyl)ethane, bis(methoxydiphenylsilyl)ethane, bis(ethoxydiphenylsilyl)ethane, 1,3-bis(hexamethoxysilyl)propane, 1,3-bis(hexaethoxysilyl)propane, 1,3-bis(hexaphenoxysilyl)propane, 1,3-bis(dimethoxymethylsilyl)propane, 1,3-bis(diethoxymethylsilyl)propane, 1,3-bis(dimethoxyphenylsilyl)propane, 1,3-bis(diethoxyphenylsilyl)propane, 1,3-bis(methoxydimehylsilyl)propane, 1,3-bis(ethoxydimethylsilyl)propane, 1,3-bis(methoxydiphenylsilyl)propane, and 1,3-bis(ethoxydiphenylsilyl)propane. Typically, these are hexamethoxydisilane, hexaethoxydisilane, hexaphenoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,1,2,2-tetraethoxy-1,2-diphenyldisilane, 1,2-dimethoxy-1,1,2,2-tetramethyldisilane, 1,2-diethoxy-1,1,2,2-tetramethyldisilane,1,2-dimethoxy-1,1,2,2-tetraphenyldisilane, 1,2-diethoxy-1,1,2,2-tetraphenyldisilane, bis(hexamethoxysilyl)methane, bis(hexaethoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane, and bis(ethoxydiphenylsilyl)methane.

In the present invention, it is typical to use a combination of an alkyltrialkoxysilane and a tetraalkoxysilane among the compounds (1) and (2) enumerated above. In this case, the proportion of the tetraalkoxysilane is generally from about 5 to about 75% by weight, typically from about 10 to about 70% by weight, more typically from about 15 to about 70% by weight, and that of the alkyltrialkoxysilane is generally from about 25 to about 95% by weight, typically from about 30 to about 90% by weight, more typically from about 30 to about 85% by weight, in terms of the amount of the product of complete hydrolysis and condensation. When a tetraalkoxysilane and a trialkoxysilane are used in a proportion within that range, the coating film obtained has a high modulus of elasticity and an exceedingly low dielectric constant.

The term "product of complete hydrolysis and condensation" as used herein means a product in which all the $R^2O$—, $R^4O$—, and $R^5O$— groups in the compounds (1) and (2) have been hydrolyzed into SiOH groups and completely condensed to form a siloxane structure.

The compounds (1) and (2) are hydrolyzed and condensed in an organic solvent. Water is typically used in the hydrolysis and condensation in an amount of from about 0.3 to about 10 mol per mol of the groups represented by $R^2O$—, $R^4O$—, and $R^5O$— in formulae (1) and (2).

A catalyst is generally used for the hydrolysis and condensation of the compounds (1) and (2) in an organic solvent.

Examples of the catalyst include organic acids, inorganic acids, organic bases, inorganic bases, and metal chelates.

Examples of the organic acids include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acids, phthalic acid, fumaric acid, citric acid, and tartaric acid.

Examples of the inorganic acids include hydrochloric acid, nitric acid, sulfuric acid, hydrofluoric acid, and phosphoric acid.

Examples of the inorganic bases include ammonia, sodium hydroxide, potassium hydroxide, barium hydroxide, and calcium hydroxide.

Examples of the organic bases include methanolamine, ethanolamine, propanolamine, butanolamine, N-methylmethanolamine, N-ethylmethanolamine, N-propylmethanolamine, N-butylmethanolamine, N-methylethanolamine, N-ethylethanolamine, N-propylethanolamine, N-butylethanolamine, N-methylpropanolamine, N-ethylpropanolamine, N-propylpropanolamine, N-butylpropanolamine, N-methylbutanolamine, N-ethylbutanolamine, N-propylbutanolamine, N-butylbutanolamine, N,N-dimethylmethanolamine, N,N-diethylmethanolamine, N,N-dipropylmethanolamine, N,N-dibutylmethanolamine, N,N-dimethylethanolamine, N,N-diethylethanolamine, N,N-dipropylethanolamine, N,N-dibutylethanolamine, N,N-dimethylpropanolamine, N,N-diethylpropanolamine, N,N-dipropylpropanolamine, N,N-dibutylpropanolamine, N,N-dimethylbutanolamine, N,N-diethylbutanolamine, N,N- dipropylbutanolamine, N,N-dibutylbutanolamine, N-methyldimethanolamine, N-ethyldimethanolamine, N-propyldimethanolamine, N-butyldimethanolamine, N-methyldiethanolamine, N-ethyldiethanolamine, N-propyldiethanolamine, N-butyldiethanolamine, N-methyldipropanolamine, N-ethyldipropanolamine, N-propyldipropanolamine, N-butyldipropanolamine, N-methyldibutanolamine, N-ethyldibutanolamine, N-propyldibutanolamine, N-butyldibutanolamine, N-(aminomethyl)methanolamine, N-(aminomethyl)ethanolamine, N-(aminomethyl)propanolamine, N-(aminomethyl)butanolamine, N-(aminoethyl)methanolamine, N-(aminoethyl)ethanolamine, N-(aminoethyl)propanolamine, N-(aminoethyl)butanolamine, N-(aminopropyl)methanolamine, N-(aminopropyl)ethanolamine, N-(aminopropyl)propanolamine, N-(aminopropyl)butanolamine, N-(aminobutyl)methanolamine, N-(aminobutyl)ethanolamine, N-(aminobutyl)propanolamine, N-(aminobutyl)butanolamine, methoxymethylamine, methoxyethylamine, methoxypropylamine, methoxybutylamine, ethoxymethylamine, ethoxyethylamine, ethoxypropylamine, ethoxybutylamine, propoxymethylamine, propoxyethylamine, propoxypropylamine, propoxybutylamine, butoxymethylamine, butoxyethylamine, butoxypropylamine, butoxybutylamine, methylamine, ethylamine, propylamine, butylamine, N,N-dimethylamine, N,N-diethylamine, N,N-dipropylamine, N,N-dibutylamine, trimethylamine, triethylamine, tripropylamine, tributylamine, tetramethylammonium hydroxide, tetraethylammonium hydroxide, tetrapropylammonium hydroxide, tetrabutylammonium hydroxide, tetramethylethylenediamine, tetraethylethylenediamine, tetrapropylethylenediamine, tetrabutylethylenediamine, methylaminomethylamine, methylaminoethylamine, methylaminopropylamine, methylaminobutylamine, ethylaminomethylamine, ethylaminoethylamine, ethylaminopropylamine, ethylaminobutylamine, propylaminomethylamine, propylaminoethylamine, propylaminopropylamine, propylaminobutylamine, butylaminomethylamine, butylaminoethylamine, butylaminopropylamine, butylaminobutylamine, pyridine, pyrrole, piperazine, pyrrolidine, piperidine, picoline, morpholine, methylmorpholine, diazabicyclooctane, diazabicyclononane, diazabicycloundecene, and urea.

Examples of the metal chelates include titanium chelate compounds such as triethoxymono(acetylacetonato)titanium, tri-n-propoxymono(acetylacetonato)titanium, triisopropoxymono(acetylacetonato)titanium, tri-n-butoxymono(acetylacetonato)titanium, tri-sec-butoxymono(acetylacetonato)titanium, tri-tert-butoxymono(acetylacetonato)titanium, diethoxybis(acetylacetonato)titanium, di-n-propoxybis(acetylacetonato)titanium, diisopropoxybis(acetylacetonato)titanium, di-n-butoxybis(acetylacetonato)titanium, di-sec-butoxybis(acetylacetonato)titanium, di-tert-butoxybis(acetylacetonato)titanium, monoethoxytris(acetylacetonato)titanium, mono-n-propoxytris(acetylacetonato)titanium, monoisopropoxytris(acetylacetonato)titanium, mono-n-butoxytris(acetylacetonato)titanium, mono-sec-butoxytris(acetylacetonato)titanium, mono-tert-butoxytris(acetylacetonato)titanium, tetrakis(acetylacetonato)titanium, triethoxymono(ethylacetoacetato)titanium, tri-n-propoxymono(ethylacetoacetato)titanium, triisopropoxymono(ethylacetoacetato)titanium, tri-n-butoxymono(ethylacetoacetato)titanium, tri-sec-butoxymono(ethylacetoacetato)titanium, tri-tert-butoxymono(ethylacetoacetato)titanium, diethoxybis(ethylacetoacetato)titanium, di-n-propoxybis(ethylacetoacetato)titanium, disopropoxybis(ethylacetoacetato)titanium, di-n-butoxybis(ethylacetoacetato)titanium, di-sec-butoxybis(ethylacetoacetato)titanium, di-tert-butoxybis(ethylacetoacetato)titanium, monoethoxytris(ethylacetoacetato)titanium, mono-n-propoxytris(ethylacetoacetato)titanium, monoisopropoxytris(ethylacetoacetato)titanium, mono-n-butoxytris(ethylacetoacetato)titanium, mono-sec-butoxytris(ethylacetoacetato)titanium, mono-tert-butoxytris(ethylacetoacetato)titanium, tetrakis(ethylacetoacetato)titanium, mono(acetylacetonato)tris(ethylacetoacetato)titanium, bis(acetylacetonato)bis(ethylacetoacetato)titanium, and tris(acetylacetonato)mono(ethylacetoacetato)titanium; zirconium chelate compounds such as triethoxymono(acetylacetonato)zirconium, tri-n-propoxymono(acetylacetonato)zirconium, triisopropoxymono(acetylacetonato)zirconium, tri-n-butoxymono(acetylacetonato)zirconium, tri-sec-butoxymono(acetylacetonato)zirconium, tri-tert-butoxymono(acetylacetonato)zirconium, diethoxybis(acetylacetonato)zirconium, di-n-propoxybis(acetylacetonato)zirconium, disopropoxybis(acetylacetonato)zirconium, di-n-butoxybis(acetylacetonato)zirconium, di-sec-butoxybis(acetylacetonato)zirconium, di-tert-butoxybis(acetylacetonato)zirconium, monoethoxytris(acetylacetonato)zirconium, mono-n-propoxytris(acetylacetonato)zirconium, monoisopropoxytris(acetylacetonato)zirconium, mono-n-butoxytris(acetylacetonato)zirconium, mono-sec-butoxytris(acetylacetonato)zirconium, mono-tert-butoxytris(acetylacetonato)zirconium, tetrakis(acetylacetonato)zirconium, triethoxymono(ethylacetoacetato)zirconium, tri-n-propoxymono(ethylacetoacetato)zirconium, triisopropoxymono(ethylacetoacetato)zirconium, tri-n-butoxymono(ethylacetoacetato)zirconium, tri-sec-butoxymono(ethylacetoacetato)zirconium, tri-tert-butoxymono(ethylacetoacetato)zirconium, diethoxybis(ethylacetoacetato)zirconium, di-n-propoxybis(ethylacetoacetato)zirconium, diisopropoxybis(ethylacetoacetato)zirconium, di-n-butoxybis(ethylacetoacetato)zirconium, di-sec-butoxybis(ethylacetoacetato)zirconium, di-tert-butoxybis(ethylacetoacetato)zirconium, monoethoxytris(ethylacetoacetato)zirconium, mono-n-propoxytris(ethylacetoacetato)zirconium, monoisopropoxytris(ethylacetoacetato)zirconium, mono-n-butoxytris(ethylacetoacetato)zirconium, mono-sec-butoxytris(ethylacetoacetato)zirconium, mono-tert-butoxytris(ethylacetoacetato)zirconium, tetrakis(ethylacetoacetato)zirconium, mono(acetylacetonato)tris(ethylacetoacetato)zirconium, bis(acetylacetonato)bis(ethylacetoacetato)zirconium, and tris(acetylacetonato)mono(ethylacetoacetato)zirconium; and aluminum chelate compounds such as tris(acetylacetonato)aluminum and tris(ethylacetoacetato)aluminum.

The amount of the catalyst to be used is generally from about 0.0001 to about 1 mol, typically from about 0.001 to about 0.1 mol, per mol of the total amount of the compounds (1) and (2).

In the case where the siloxane compound is a condensate, it typically has a weight-average molecular weight, calculated for standard polystyrene, of from about 500 to about 100,000.

In the invention, the siloxane compound is usually dissolved in an organic solvent and applied as a coating composition.

Examples of the solvent which can be used in the invention include aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, diisopropylbenzene, n-amylnaphthalene, and trimethylbenzene; monohydric alcohols such as methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol diacetone alcohol, and cresol; polyhydric alcohols such as ethylene glycol, 1,2-propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerol; ketone solvents such as acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclohexanone, methylcyclohexanone, 2,4-pentanedione, acetonylacetone, diacetone alcohol, acetophenone, and fenchone; ether solvents such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropyl glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propanesultone. These solvents can be used alone or as a mixture of two or more thereof.

An organic solvent having a boiling point lower than about 250° C. is typically used in the present invention. Examples thereof include alcohols such as methanol, ethanol, and isopropanol; polyhydric alcohols such as ethylene glycol and glycerol; glycol ether solvents such as ethylene glycol monomethyl ether, ethylene glycol monobutyl ether, diethyl glycol monoethyl ether, diethylene glycol diethyl ether, propylene glycol monopropoyl ether, and dipropylene glycol monoethyl ether; glycol acetate/ether solvents such as ethylene glycol monomethyl ether acetate, diethylene glycol monobutyl ether acetate, ethylene glycol diacetate, and propylene glycol methyl ether acetate; amide solvents such as N,N-dimethylacetamide, N,N-dimethylformamide, and N-methyl-2-pyrrolidone; ketone solvents such as acetone, methyl ethyl ketone, methyl isobutyl ketone, acetylacetone, and methyl amyl ketone; and carboxylic ester solvents such as ethyl lactate, methoxymethyl propionate, and ethoxyethyl propionate. These solvents may be used alone or in combination of two or more thereof.

The amount of the organic solvent to be used in the invention is generally from about 0.3 to about 25 times (by weight) the amount of the siloxane compound (in terms of the product of complete hydrolysis and condensation). The coating composition for use in the present invention can be produced by mixing the siloxane compound with an organic solvent together with other ingredients according to need.

Although porous dielectric materials having low dielectric constants are desirable, it would be advantageous to have a porous dielectric material with a higher elastic modulus and material hardness.

In order to raise the elastic modulus of the porous dielectric material, it is exposed to a plasma cure. In accordance with the present invention, the process utilizes a fluorine-free plasma gas. By "fluorine-free" we mean a plasma gas that does not contain fluorine species. For example, the fluorine-free plasma gas can be a combination of $CH_4$ and $N_2$, or $CH_4$ and $N_2$ in combination with $H_2$ or a noble gas such as, for example, He, Ar, Ne, or combinations thereof.

By utilizing a fluorine-free plasma gas, there is no opportunity for fluorine species to react with or penetrate into the porous low-k material. Trapping of such fluorine species in the porous network can lead to voiding, corrosion, and other forms of damage to the dielectric material, which can cause the immediate failure of a device containing such material, as well as affect device yield and/or significantly reduce the useful lifetime of the device. Moreover, unbound fluorine species can move through the dielectric and react with other absorbed or trapped residual compounds, or reach interfaces to other materials within the dielectric causing severe damage. Accordingly, the present invention by employing a fluorine-free plasma gas for curing of the porous dielectric material significantly reduces or eliminates the presence of fluorine species in the film.

The fluorine-free plasma cure can be done by radio frequency (RF), inductive coupled, RF capacitive coupled, helical resinator, microwave downstream, and microwave electron cyclotron resonance (ECR) plasma. The fluorine-free plasma curing process improves the mechanical properties of the porous low-k dielectric material, increasing material hardness while maintaining the dielectric pore, structure, density, and electrical properties.

In a typical fluorine-free plasma curing process, the wafer is quickly heated in a rapid temperature ramp-up step to the desired temperature, and the wafer is plasma cured with a gas mixture comprising $CH_4$ and $N_2$, which generates the curing plasma chemistry. The plasma gas is devoid of any plasma fluorine.

The exact conditions for the fluorine-free plasma cure depend upon what type of plasma cure is being used. Typically, the porous dielectric material is plasma cured at a process pressure between about 1.0 Torr and about 5.0 Torr. Examples of typical microwave plasma cure conditions for a 200 mm wafer are illustrated in Table 1 below.

TABLE 1

Typical Fluorine-Free Plasma Cure Conditions for a 200 mm Wafer

| | |
|---|---|
| Microwave Plasma Power: | 1000–2000 W |
| Wafer Temperature: | 250–450° C. |
| Process Pressure: | 1.0–5.0 Torr |
| Plasma Cure Time: | <180 seconds |
| Plasma Gasses: | $CH_4/N_2$ or $CH_4/N_2/H_2$ |
| $CH_4/N_2$ Flow Rate: | 2000–3000 sccm |
| CH4: $N_2$ Gas Ratio: | 0.01 to 0.05 |

The elastic modulus and material hardness of the fluorine-free plasma cured porous dielectric materials of the present invention are comparable to or higher than those of a furnace (thermally) cured porous dielectric material. The elastic modulus of furnace cured porous dielectric materials is typically between about 0.5 GPa and about 5 GPa when the dielectric constant is between 1.6 and 2.4. The elastic modulus of the fluorine-free plasma cured porous dielectric material of the instant invention is typically greater than or about 3 GPa, and more typically between about 3. GPa and about 10 GPa. The material hardness of furnace cured porous films is between about 0.1 and about 0.8 GPa. Typically, the material hardness of the fluorine-free plasma cured porous dielectric material of the present invention is greater than or about 0.3 GPa, and more typically between about 0.5 GPa and 1.0 GPa.

A comparison of process conditions and material properties for the fluorine-free plasma cure process of the present invention, a fluorine-containing plasma cure process, and a vertical furnace thermal cure process are presented in Table 2 below.

TABLE 2

Process Conditions and Material Properties for Different Cure Conditions

| | Fluorine-Free Plasma Cure | Fluorine-Containing Plasma Cure | Vertical Furnace Thermal Cure |
|---|---|---|---|
| Tool | Plasma Cure | Plasma Cure | Vertical Furnace |
| Atmosphere | $CH_4/N_2$ | $CF_4 + H_2/N_2$ | LP STD |
| Pressure (Torr) | 3.50 | 3.50 | 0.15 |
| Cure Temp. (° C.) | 420 | 420 | 420 |
| Cure Time (min.) | 2 | 1.5 | 60 |
| Plasma Power | 2000 W | 2000 W | n/a |
| R.I. | 1.2458 | 1.2580 | 1.2514 |
| Th/A | 6036 | 6252 | 5972 |
| 3σ (%) | 1.5 | 1.45 | 1.5 |
| Film Shrink (%) | −1.9 | −2.8 | −2.7 |
| Dielectric Constant (k) | 2.32 | 2.23 | 2.22 |
| Dielectric Constant at 200° C. | 2.15 | 2.13 | 2.12 |
| Delta k | 0.17 | 0.10 | 0.10 |
| Elastic Modulus (GPa) | 3.82 at 0.20 st. dev. | 3.95 at 0.16 st. dev. | 3.82 at 0.13 st. dev. |
| Material Hardness (GPa) | 0.62 at 0.02 st. dev. | 0.62 at 0.05 st. dev. | 0.63 at 0.03 st. dev. |

Table 2 shows fluorine-free plasma cure results in reduced thermal budget. The process time is reduced from 60 minutes for the vertical furnace thermal cure to 2 minutes for the fluorine-free plasma cure, while the temperature is comparable (420° C.). The fluorine-free plasma cured porous dielectric materials of the present invention have comparable chemical stability and improved dimensional stability to the furnace cured materials. By chemical stability, we mean that the fluorine-free porous dielectric materials are resistant to chemicals, such as cleaning solutions and chemical polishing solutions, and plasma damaging during photoresist ashing and dry etching processes.

The fluorine-free plasma cure significantly reduces or eliminates the outgassing of oliomeric polysilica and other substances from the porous films compared to furnace or thermal cured low-k film. In addition, unlike plasma cure processes that utilize a plasma gas comprising fluorine, the fluorine-free plasma cure process of the present invention does not generate a notable amount of polar species in the film. Ordinarily, with such fluorine-based plasma cure processes, the initial plasma curing of the film can introduce chemical and electrical changes that are reversed or repaired by employing a second post-cure plasma treatment to condition the film. However, by employing a fluorine-free plasma gas, the plasma cure process of the present invention defines a single-phase process that cures the film without causing unwanted changes therein. Accordingly, an additional post-cure treatment of the film need not be performed.

While certain representative embodiments and details have been shown for purposes of illustrating the invention, it will be apparent to those skilled in the art that various changes in the compositions and methods disclosed herein may be made without departing from the scope of the invention. Accordingly, it is intended that the invention not be limited to the disclosed embodiments, but that is have the full scope permitted by the language of the following claims.

What is claimed is:

1. A process for making a fluorine-free plasma cured material comprising:
   providing an uncured Si-containing porous dielectric material having a first dielectric constant, having a first elastic modulus, and having a first material hardness;
   exposing the uncured Si-containing porous dielectric material to a fluorine-free plasma gas; and plasma curing the uncured Si-containing porous dielectric material with fluorine-free plasma gas to produce a plasma cured porous dielectric material having a second dielectric constant which is less than or about equal to the first dielectric constant, having a second elastic modulus which is greater than the first elastic modulus, and having a second material hardness which is greater than the first material hardness, wherein the fluorine-free plasma gas comprises a combination of $CH_4$ plasma gas and $N_2$ plasma gas.

2. The process of claim 1 wherein the uncured Si-containing porous dielectric material is selected from an organic dielectric material, an inorganic dielectric material, or a combination thereof.

3. The process of claim 1 wherein the uncured Si-containing porous dielectric material is selected from a hydrogen silsesquioxane dielectric material, a methylsilsesquioxane dielectric material, or a combination thereof.

4. The process of claim 1 wherein the uncured Si-containing porous dielectric material is produced by depositing a dielectric coating on a substrate using a spin-on process or a chemical vapor deposition process, and forming pores in the coating.

5. The process of claim 1 wherein the uncured Si-containing porous dielectric material is selected from a porogen-generated porous dielectric material, a solvent-formed porous dielectric material, a molecular engineered porous dielectric material, or a combination thereof.

6. The process of claim 1 wherein the uncured Si-containing porous dielectric material is plasma cured at a temperature less than or about 450° C.

7. The process of claim 1 wherein the uncured Si-containing porous dielectric material is plasma cured at a temperature between about 250° C. and about 450° C.

8. The process of claim 1 wherein the uncured Si-containing porous dielectric material is plasma cured at a process pressure between about 1.0 Torr and about 5.0 Torr.

9. The process of claim 1 wherein the uncured Si-containing porous dielectric material is plasma cured for a time less than or about 180 seconds.

10. The process of claim 1 wherein the fluorine-free plasma gas further comprises $H_2$ plasma gas.

11. The process of claim 1 wherein the fluorine-free plasma gas further comprises a noble gas.

12. The process of claim 11 wherein the noble gas is selected from He, Ar, Ne, or combinations thereof.

13. The process of claim 1 wherein the fluorine-free plasma gas defines a gas ratio of $CH_4$ to $N_2$, and wherein the gas ratio is about 0.01 to about 0.05.

14. The process of claim 1 wherein the increase in elastic modulus between the first elastic modulus of the uncured Si-containing porous dielectric material and the second elastic modulus of the plasma cured porous dielectric material is greater than or about 50%.

15. The process of claim 1 wherein the increase in elastic modulus between the first elastic modulus of the uncured Si-containing porous dielectric material and the second elastic modulus of the plasma cured porous dielectric material is greater than or about 100%.

16. The process of claim 1 wherein the second elastic modulus of the plasma cured porous dielectric material is greater than or about 3 GPa.

17. The process of claim 1 wherein the second elastic modulus of the plasma cured porous dielectric material is between about 3 GPa and about 10 GPa.

18. The process of claim 1 wherein the increase in material hardness between the first material hardness of the uncured Si-containing porous dielectric material and the second material hardness of the plasma cured porous dielectric material is greater than or about 50%.

19. The process of claim 1 wherein the second material hardness of the plasma cured porous dielectric material is greater than or about 0.3 GPa.

20. The process of claim 1 wherein the second material hardness of the plasma cured porous dielectric material is between about 0.5 GPa and about 1.0 GPa.

21. The process of claim 1 wherein a level of outgassing of the plasma cured porous dielectric material is significantly reduced or eliminated as compared to a thermal cured Si-containing porous dielectric material.

* * * * *

UNITED STATES PATENT AND TRADEMARK OFFICE
CERTIFICATE OF CORRECTION

PATENT NO. : 7,011,868 B2
APPLICATION NO. : 10/627894
DATED : March 14, 2006
INVENTOR(S) : Waldfried et al.

It is certified that error appears in the above-identified patent and that said Letters Patent is hereby corrected as shown below:

Col. 6, line 1, "di-n-propyldi-tert-butoxysiane," should read --di-n-propyldi-tert-butoxysilane,--

Col. 13, line 33, "CH4:" should read --$CH_4$--

Col. 13, line 43, "about 3. Gpa" should read --about 3 Gpa--

Col. 15, line 2, "material with" should read --material with the--

Signed and Sealed this

Eighth Day of August, 2006

JON W. DUDAS
*Director of the United States Patent and Trademark Office*

UNITED STATES PATENT AND TRADEMARK OFFICE
CERTIFICATE OF CORRECTION

PATENT NO. : 7,011,868 B2 Page 1 of 1
APPLICATION NO. : 10/627894
DATED : March 14, 2006
INVENTOR(S) : Waldfried et al.

It is certified that error appears in the above-identified patent and that said Letters Patent is hereby corrected as shown below:

(73) Assignee: "Axcelis Technologies, Inc., Beverly, MA (US)" should read --Axcelis Technologies, Inc., Beverly, MA (US) and JSR Corporation, Tokyo, Japan--.

Signed and Sealed this

Twenty-ninth Day of August, 2006

JON W. DUDAS
*Director of the United States Patent and Trademark Office*